United States Patent
Aiura et al.

(10) Patent No.: US 8,865,483 B2
(45) Date of Patent: Oct. 21, 2014

(54) SUBSTRATE PROCESSING APPARATUS AND SUBSTRATE PROCESSING METHOD

(71) Applicant: Tokyo Electron Limited, Tokyo (JP)

(72) Inventors: Kazuhiro Aiura, Kumamoto (JP); Norihiro Itoh, Kumamoto (JP); Yusuke Hashimoto, Kumamoto (JP); Takashi Nagai, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/956,705

(22) Filed: Aug. 1, 2013

(65) Prior Publication Data
US 2014/0045281 A1   Feb. 13, 2014

(30) Foreign Application Priority Data

Aug. 10, 2012 (JP) ................................. 2012-178371

(51) Int. Cl.
| | |
|---|---|
| H01L 21/66 | (2006.01) |
| C09J 1/00 | (2006.01) |
| H01L 21/67 | (2006.01) |
| H01L 21/687 | (2006.01) |

(52) U.S. Cl.
CPC .......... H01L 22/30 (2013.01); H04L 21/68728 (2013.01); H01L 21/67259 (2013.01); H01L 21/68792 (2013.01)
USPC ............................. 438/16; 438/7; 156/345.24

(58) Field of Classification Search
USPC ..................... 438/7, 8, 14, 16, 401, 462, 975; 156/345.24, 345.25
See application file for complete search history.

(56) References Cited

U.S. PATENT DOCUMENTS

| | | | | |
|---|---|---|---|---|
| 6,764,379 | B2 * | 7/2004 | Finarov | 451/6 |
| 7,569,119 | B2 * | 8/2009 | Tang | 156/345.16 |
| 8,138,444 | B2 * | 3/2012 | Kim | 219/121.36 |

FOREIGN PATENT DOCUMENTS

JP   08-316290 A   11/1996

* cited by examiner

*Primary Examiner* — Kevin M Picardat
(74) *Attorney, Agent, or Firm* — Abelman, Frayne & Schwab

(57) ABSTRACT

Provided is a substrate processing apparatus in which flexibility of disposing a device configured to determine a holding state of a substrate and the flexibility of timing of determining the holding state are enhanced. The substrate processing apparatus includes a light projector configured to radiate detection light toward a region where a substrate may exist when the substrate is held by a substrate holding member and a light receiver configured to receive the detection light radiated from the light projector. A light path of the detection light from the light projector toward the light receiver passes a substrate surrounding member installed around the substrate held by the substrate holding member. The detection light penetrates the substrate surrounding member and has a wavelength which does not penetrate the substrate.

15 Claims, 4 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2012-178371 filed on Aug. 10, 2012 with the Japan Patent Office and the disclosure of which is incorporated herein in its entirety by reference.

TECHNICAL FIELD

The present disclosure relates to a technique of optically detecting a holding state of a substrate by a substrate holding member in a substrate processing apparatus which performs a predetermined processing on the substrate in a state in which the substrate is held by the substrate holding member.

BACKGROUND

A liquid processing process is one of various processes of manufacturing a semiconductor device. In the liquid processing process, a substrate such as, e.g., a semiconductor wafer is processed by rotating the substrate around a vertical axis line and supplying a processing liquid to the rotating substrate. When performing the liquid processing process, for example, if the substrate is laid on the substrate holding member without being properly held by the substrate holding member, there is a concern that the substrate may be damaged by falling off from the substrate holding member due to the rotation. Thus, it is necessary to confirm whether the substrate is properly held before starting the processing.

Japanese Patent Laid-Open Publication No. H8-316290 discloses a rotary substrate processing apparatus including a substrate holding state determination means configured to optically confirm a substrate holding state of a substrate holding member. The substrate holding state determination means is provided with plural sets of light projectors and light receivers and a light projector and a light receiver of each set are disposed outside of circumferential edge portion of the substrate to be opposite to each other in the diametric direction of the substrate. The substrate processing apparatus of Japanese Patent Laid-Open Publication No. H8-316290 is provided with an elevatable cup configured to receive a processing liquid supplied to a rotating substrate and scattered to the outside by centrifugal force when the processing is performed. The projector and the light receiver of each set are disposed to be positioned at the outside of the cup which is at a raised position. The holding state of the substrate is determined when the cup is at a lowered position. When it is determined that the retaining state of the substrate is proper, the cup moves to the raised position surrounding the substrate, the processing liquid is supplied to the rotating substrate, and a predetermined liquid processing is performed in this state.

The substrate holding state determination means of Japanese Patent Laid-Open Publication No. H8-316290 may confirm the holding state only when the cup is located at a height lower than the substrate so that the surrounding space of the circumferential edge of the substrate is opened. That is, the substrate holding state determination means of Japanese Patent Laid-Open Publication No. H8-316290 may not be applicable to a substrate processing apparatus which is configured such that a substrate holding operation of the substrate holding member is performed within the cup. Although above limitation may be resolved by disposing a light projector and a light receiver within the cup, it is not desirable to dispose the light projector and the light receiver within the cup considering a wet environment or a corrosive environment within the cup.

SUMMARY

The present disclosure provides a substrate processing apparatus including: a substrate holding member configured to retain a substrate; a substrate surrounding member which is a configurational member of the substrate processing apparatus and provided so as to be disposed around the substrate retained by the substrate holding member; a projector configured to radiate detection light; and a light receiver configured to receive the detection light radiated from the projector. The projector and the light receiver are provided at a location where a light path of the detection light from the projector toward the light receiver passes a region where the substrate may exist when the substrate is retained by the substrate holding member and passes the substrate surrounding member and the detection light radiated from the projector has a wavelength which penetrates the substrate surrounding member but does not penetrate the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A and 3B are views describing the holding state of a substrate in which

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure provides a substrate processing apparatus in which the flexibility of disposing a substrate holding state determination device configured to determine a holding state of a substrate by a substrate holding member and the flexibility of timing of determining the holding state are enhanced.

According to the present disclosure, provided is a substrate processing apparatus including: a substrate retaining member configured to retain a substrate; a substrate surrounding member which is a configurational member of the substrate processing apparatus and provided so as to be disposed around the substrate retained by the substrate retaining member; a projector configured to radiate detection light; and a light receiver configured to receive the detection light radiated from the projector and in which the projector and the light receiver are provided at a location where a light path of the detection light from the projector toward the light receiver passes a region where the substrate may exist when the substrate is retained by the substrate retaining member and passes the substrate surrounding member and the detection light radiated from the projector has a wavelength which penetrates the substrate surrounding member but does not penetrate the substrate.

In the above-described substrate processing apparatus, the projector and the light receiver are disposed at a location where the light path is blocked by the substrate when the substrate is retained by the substrate retaining member in an abnormal state and, also, the light path is not blocked by the substrate when the substrate is retained by the substrate retaining member in a normal state.

Also, in the above-described substrate processing apparatus, the substrate surrounding member includes the substrate retaining member and the light path of the detection light is set at a location where it passes the front end portion of the substrate retaining member retaining the substrate in the normal state.

Further, in the above-described substrate processing apparatus, the projector and the light receiver are disposed at a location where the light path is blocked by a substrate retained by the substrate retaining member when the substrate is retained by the substrate retaining member normally.

Furthermore, the above-described substrate processing apparatus further includes a plate which supports the substrate retaining member and approaches the substrate from the lower side of the substrate retained by the substrate retaining member. The substrate surrounding member includes the plate and the light path of the detection light is set at a location where it passes the plate vertically.

The above-described substrate processing apparatus further includes a plate which supports the substrate retaining member and approaches the substrate from the lower side of the substrate retained by the substrate retaining member and the substrate surrounding member includes the plate and the substrate retaining member. The projector and the light receiver are provided in two sets and the projector and the light receiver of a first set among the two sets of the projector and the light receiver are provided at a location where the light path of the detection light from the projector of the first set toward the light receiver does not pass the substrate when the substrate is retained by the substrate retaining member normally and passes the front end portion of the substrate retaining member while the light path of the detection light from the projector of the first set toward the light receiver is blocked by the surmounting substrate when the substrate retaining member gets surmounted by the substrate. Also, the projector and the light receiver of a second set among the two sets of the projector and the light receiver are provided at a location where the light path of the detection light from the projector of the second set toward the light receiver passes the plate vertically and, when the substrate is retained by the substrate retaining member in the normal state, the light path of the detection light from the projector of the second set toward the light receiver is blocked by the substrate retained by the substrate retaining member in the normal state.

In the above-described substrate processing apparatus, the substrate surrounding member includes a substrate besieging member configured to besiege the circumference of the substrate retained by the substrate retaining member and at least one of the projector and the light receiver is disposed at the outer side of the substrate besieging member.

Also, the above-described substrate processing apparatus further includes a processing liquid nozzle configured to supply a processing liquid to the substrate retained by the substrate retaining member and a rotation driving unit configured to rotate the substrate retaining member. The substrate besieging member is a cup body receiving the processing liquid which has been supplied from the processing liquid nozzle to the substrate and scattered toward the outer side of the substrate by centrifugal force and the projector and the light receiver are disposed at the outer side of the cup body.

The above-described substrate processing apparatus further includes a case configured to accommodate the substrate retaining member and the substrate surrounding member and the projector is installed at the outer side of the case.

In the substrate processing apparatus, the substrate is formed of silicon or silicon compound and the substrate surrounding member which the light path passes is formed of a resin material.

In the substrate processing apparatus, the wavelength is 1100 nm or less.

Also, in the substrate processing apparatus, the projector has an LED ("light emitting diode") as a light emitting device.

A substrate processing method includes: a step of retaining a substrate by a substrate retaining member; a step of radiating detection light from a projector, receiving the detection light by a light receiver, and judging a retaining state of the substrate retained by the substrate retaining member based on presence/absence of light receiving or a light receiving state by the light receiver; and a step of supplying a processing fluid to the substrate retained by the substrate retaining member and performing a processing on the substrate after it has been judged that the substrate is retained properly by the substrate retaining member. Also, the projector and the light receiver are provided at a location where a light path of the detection light from the projector toward the light receiver passes a region where a substrate may exist when a substrate is retained by the substrate retaining member and passes the substrate surrounding member, and the detection light radiated from the projector has a wavelength which penetrates the substrate surrounding member but does not penetrate the substrate.

In the above-described substrate processing method, a processing of the substrate is not performed and a judgment result is notified when it is judged that the substrate is not retained or retained improperly by the substrate retaining member.

Also, in the above-described substrate processing method, the step of judging the retaining state of the substrate is continuously executed even after a processing is started and the processing of the substrate is ended and a judgment result is notified when it is judged that abnormality has occurred to the retaining state.

According to the present disclosure, the flexibility of disposing a device configured to judge the retaining state of a substrate and the flexibility of execution timing of retaining state judgment may be significantly enhanced.

Hereinafter, exemplary embodiments of the present disclosure will be described with reference to the attached drawings.

The substrate processing apparatus includes: a case 10; a disk-shaped holding plate 30 provided within the case 10 and configured to hold a wafer W; a disk-shaped lift pin plate 20 provided at the top side of the retaining plate 30 and having a plurality of, e.g., three lift pins 22 which support the wafer W from the bottom side; a rotation driving unit 36 provided with, for example, an electrical motor configured to rotate the holding plate 30; and a processing fluid supply tube 40 provided through a through hole 30a formed at the central part of the retaining plate 30 and a through hole 20a formed at the central part of the lift pin plate 20.

A fan filter unit ("FFU") 11 is attached to the ceiling portion of the case 10 and the FFU 11 forms a downflow of clean air directing from the top to the bottom in the inner space of the case 10. One side wall 10a of the case 10 is provided with a carry-in/carry-out opening 12 of a wafer W and the carry-in/carry-out opening 12 may be opened/closed by a shutter 13. The bottom wall of the case 10 is provided with an exhaust path 14 configured to exhaust the atmosphere within the case 10.

Figure 1:
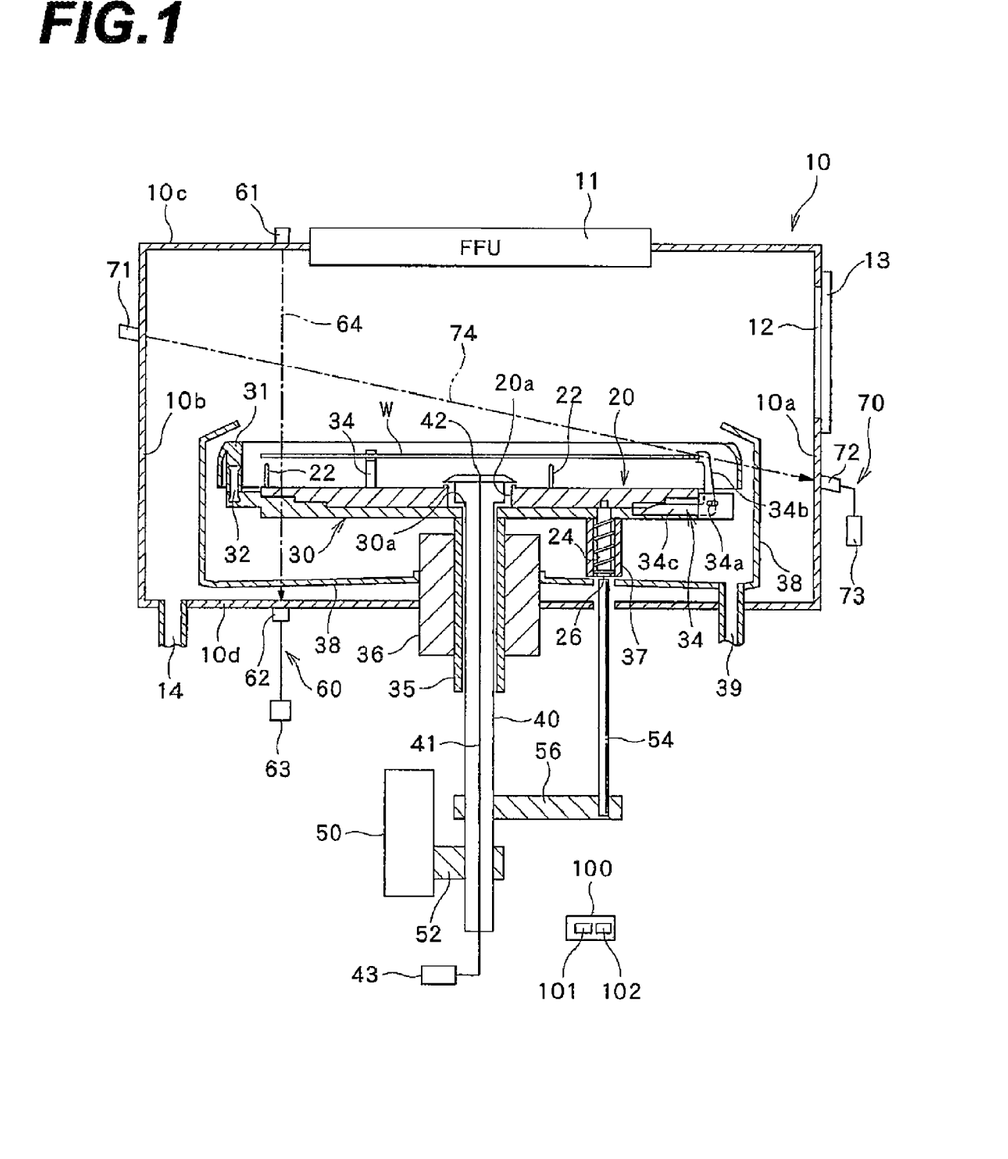
FIG. 1 is a longitudinal cross-sectional view illustrating a configuration of a substrate processing apparatus according to an exemplary embodiment of the present disclosure in a state in which a wafer is properly held by substrate holding members.
Figure 2:
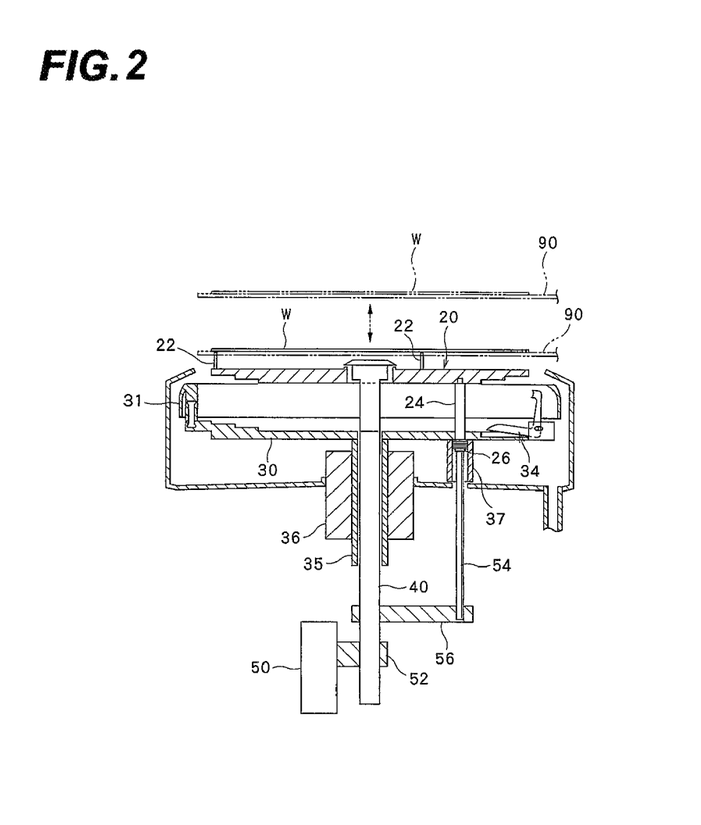
FIG. 2 is a view for describing the delivery of a wafer between the substrate processing apparatus and an external substrate conveyance arm in the substrate processing apparatus of FIG. 1 in which some of configurational members which do not participate in the delivery are omitted.

The lift pin plate 20 and the processing fluid supply tube 40 may be elevated up and down. FIG. 1 illustrates a state in which the lift pin plate 20 and the processing fluid supply tube 40 are at the lowered positions, respectively, and FIG. 2 illustrates a state in which the lift pin plate 20 and the processing fluid supply tube 40 are at the raised positions, respectively.

A rotating cup 31 is attached to the top surface of the retaining plate 30 via a connecting member 32. The rotating cup 31 surrounds the outer circumferential edge of a wafer W supported by the holding plate 30 when the lift pin plate 20 and the processing fluid supply tube 40 are at the lowered positions. The retaining plate 30 is provided with three substrate holding members 34 (two holding members are illustrated in FIG. 1 and one holding member is illustrated in FIG. 2) which hold the wafer W. The substrate holding members 34 are equally spaced along the circumferential edge of the retaining plate 30.

A hollow rotating shaft 35 is attached to the central part of the bottom surface of the holding plate 30. The hollow rotating shaft 35 extends downward from the bottom surface of the retaining plate 30. The processing fluid supply tube 40 is accommodated in the hollow part of the rotating shaft 35. The rotating shaft 35 is supported by a bearing (not illustrated) and may be rotated by the rotation driving unit 36 such as an electrical motor. Accordingly, the retaining plate 30 also rotates.

The holding plate 30 is formed with three through holes and a connecting member 24 coupled to the lift pin plate 20 slides through each of the through holes. Therefore, the connecting member 24 allows the relative vertical movement of the holding plate 30 and the lift pin plate 20 while connecting the holding plate 30 and the lift pin plate 20 such that they rotate integrally by suppressing the relative rotation of the retaining plate 30. Also, on the bottom surface of the holding plate 30, three cylindrical members 37 are provided at the locations corresponding to respective connecting members 24. Each of the cylindrical members 37 accommodates one connecting member 24. Within each of the cylindrical members 37, a spring 26 configured to urge the connecting member 24 downward is accommodated.

An outer cup 38 is provided outside the rotating cup 31 and the holding plate 30 and the rotating cup 31 are surrounded by the outer cup 38. A cleaning liquid scattered to the outside by the rotation of the wafer W after being supplied to the wafer W and received by the outer cup 38 is discharged by a drainage tube 39 connected to the outer cup 38.

Each of the substrate holding members 34 is supported by the holding plate 30 via a shaft 34a and may fluctuate around the shaft 34a. The shaft 34a is mounted with a spring member (not illustrated) such as, e.g., a torsion spring configured to urge the substrate holding member 34 to be rotated in the direction to be apart from the wafer W. Therefore, when no force is exerted on the substrate holding member 34, the substrate holding member 34 is positioned at a releasing position where the wafer W is released as illustrated in FIG. 2.

Each substrate holding member 34 has a substrate holding portion 34b and a pressed portion 34c. When the lift pin plate 20 moves from the raised position to the lowered position, the substrate holding member 34 rotates counter-clockwise in FIGS. 1 and 2 around the shaft 34a as the pressed portion 34c is pressed downward by the bottom surface of the lift pin plate 20. Accordingly, the substrate holding portion 34b is displaced to approach the wafer W. When the lift pin plate 20 reached the lowered position, the wafer W is held by three substrate holding members 34. The position of the substrate holding members 34 at this time is called a holding position. After the wafer W is held by the substrate holding members 34, the lift pin plate 20 descends a bit more and the wafer W is slightly apart from the front ends of the lift pins 22.

The processing fluid supply tube 40 passes the through hole 20a formed at the central part of the lift pin plate 20, the through hole 30a formed at the central part of the holding plate 30, and the inner space of the hollow rotating shaft 35, and is configured not to rotate even when the lift pin plate 20 and the holding plate 30 rotate. One or more fluid supply paths 41 extend in the axial direction within the processing fluid supply tube 40 so as to allow a processing fluid needed for a processing performed by the substrate processing apparatus to flow therethrough. An opening 42 of the upper end of each fluid supply path 41 forms an ejection port configured to eject the processing fluid to the substrate. Each fluid supply path 41 is supplied with a processing fluid by a fluid supply mechanism 43 schematically illustrated in the drawing. The fluid supply mechanism 43 is provided with, for example, an opening/closing valve and a flow control valve (not illustrated) which are connected to the fluid supply source. As for a processing fluid, a chemical liquid such as DHF or SC1, a rinsing liquid such as DIW, and $N_2$ gas as a drying assistant fluid may be exemplified. However, the processing fluid is not limited thereto.

The processing fluid supply tube 40 is elevated by an elevation driving unit 50 via a connecting member 52. Also, three push rods 54 (only one is illustrated) are connected to the processing fluid supply tube 40 via a link member 56. In the state illustrated in FIG. 1, when the processing fluid supply tube 40 is lifted up by the elevation driving unit 50, the push rods 54 are also lifted up in cooperation with the processing fluid supply tube 40 and the push rods 54 push upward the connecting members 24 which are at the angular positions corresponding to the push rods 54, respectively. Thus, as illustrated in FIG. 2, the lift pin plate 20 reaches the raised position. From this state, when the processing fluid supply tube 40 is moved down by the elevation driving unit 50, the lift pin plate 20 is moved to the lowered position and disposed on the holding plate 30. Also, the push rods 54 are also moved down in cooperation with the processing fluid supply tube 40 and are apart from the connecting members 24 and the connecting member 24 are moved down by the force of the springs 26.

The substrate processing apparatus further includes a first holding state determination device 60 and a second holding state determination device 70, which are configured to determine the holding state of the wafer W by the holding plate 30.

The first holding state determination device 60 is provided to detect the presence/absence of the wafer W. The second holding state determination device 70 is provided to detect whether or not the wafer W is laid on the substrate holding portions 34b of the substrate holding members 34.

The first holding state determination device 60 includes: a light projector 61 configured to radiate detection light; a light receiver 62 configured to receive the detection light and output a detection signal based on the light receiving state, and a determination unit 63 configured to determine the holding state of the wafer based on the detection signal output from the light receiver 62.

The light projector 61 is configured by a parallel beam light emitting diode ("LED") configured to radiate parallel beams as the detection light. The wavelength of the LED light is preferably 880 nm. The LED light of 880 nm is used to heat a silicon wafer, absorbed to the silicon wafer very well, and hardly penetrates the silicon wafer.

The light receiver 62 has a photo sensor which has a predetermined sensitivity, preferably high sensitivity for the wavelength of the detection light. The light receiver 62 may be configured by, for example, a charge coupled device ("CCD") two-dimensional image sensor provided with the photo sensor having the above-described sensitivity. As for the light receiver 62, a light receiver configured by a band pass filter and a window formed of, for example, quartz glass or borosilicate glass to selectively detect the LED light of wavelength 880 nm may also be preferably used.

In the illustrated exemplary embodiment, the light projector 61 is provided outside a ceiling wall 10c of the case 10 and the light receiver 62 is provided outside a bottom wall 10d of the case 10. Therefore, a light path 64 of the detection light which is radiated from the projector 61 to the light receiver 62 is set to pass the ceiling wall 10c of the case 10, the lift pin plate 20, the holding plate 30, and the bottom wall 10d of the case 10. In members that the light path 64 of the detection light passes, at least the portion where the light path 64 passes is formed of a material which transmits the detection light. As for such a material, PEEK (polyetheretherketon), PVC (polyvinylchloride), and PTFE (polytetrafluoroethylene) are exemplified. PEEK and PTFE are frequently used as a chemical resistant resin material in semiconductor manufacturing devices and there won't be any problem regarding using PEEK and PTFE as a material that forms at least a portion of the case 10, the lift pin plate 20 and the holding plate 30. Also, since most of the chemical resistant resin materials such as PEEK and PTFE, which are frequently used in the semiconductor devices, have an absorbing peak at the wavelength side longer than 1,100 nm, the wavelength of the detection light is preferably 1,100 nm or less.

As illustrate in FIG. 1, when the wafer W is held by the holding plate 30, the detection light from the light projector 61 does not reach the light receiver 62 by being blocked by the wafer W. Meanwhile, when the wafer W is not held by the holding plate 30, the detection light from the light projector 61 penetrates the ceiling wall 10c of the case 10, the lift pin plate 20, holding plate 30, and the bottom wall 10d of the case 10 and is incident on the light receiver 62. As described above, since the light receiving state of the light receiver 62 changes according to presence/absence of the wafer W and hence, the output signal output from the light receiver 62 changes, the determination unit 63 may determine the presence/absence of the wafer based on the change.

Like the first holding state determination device 60, the second holding state determination device 70 also includes a light projector 71, a light receiver 72, and a determination unit 73. The light projector 71 and the light receiver 72 may be the same as the light projector 61 and the light receiver 62.

A light path 74 of detection light which is radiated from the light projector 71 to the light receiver 72 is set to pass the side wall 10b of the case 10, the front end of the substrate holding portion 34b of the substrate holding member 34, the rotating cup 31, the outer cup 38, and the side wall 10a of the case 10. In the members that the light path 74 of the detection light passes, at least the portion where the light path 74 passes is formed of a material which transmits the detection light. For example, the rotating cup 31 and the outer cup 38 may be formed of PEEK or PTFE. Also, the light path 74 may pass a side in the vicinity of the front end of the substrate holding portion 34b rather than passing the front end of the substrate holding portion 34b of substrate holding member 34.

Figure 3A:
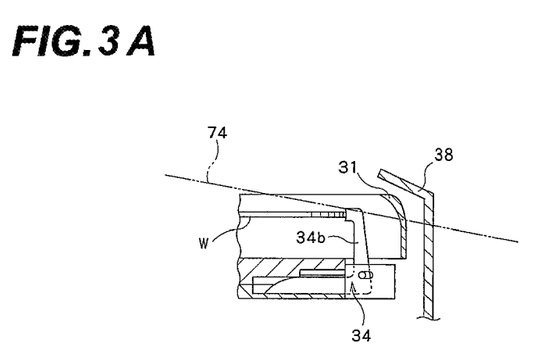
FIG. 3A illustrates a state in which the wafer is properly held by the substrate holding members and FIG. 3B illustrates a state in which the wafer is merely laid on the substrate holding members.
Figure 3B:
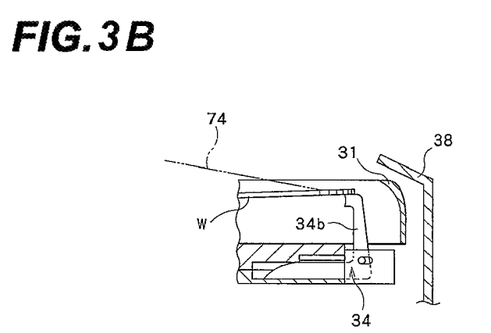

As illustrate in FIG. 3A, when the substrate holding member 34 holds the wafer W properly, the detection light radiated from the light projector 71 is incident on the light receiver 72 since the wafer W does not exist on the light path 74 of the detection light. Meanwhile, as illustrated in FIG. 3B, when the wafer W is laid on the front end of the substrate holding portion 34b, at least a portion of the detection light is blocked by the wafer W and the detection light is not incident on the light receiver 72 or the amount of incident light decreases. As described above, since the light receiving state of the light receiver 72 changes according to whether or not the wafer W is laid on and hence, the output signal output from the light receiver 72 changes, the determination unit 73 may determine whether or not the wafer is laid on based on the change.

The substrate processing apparatus includes a controller (control unit) 100 configured to generally control the entire operation. The controller 100 controls the operations of all the functional components (such as, for example, the rotation driving unit 36, the elevation driving unit 50, the fluid supply mechanism 43, the first and second holding state determination devices 60, 70). The controller 100 may be implemented by, for example, a general-purpose computer as a hardware and a program (e.g., a device control program and a processing recipe) to operate the computer as a software. The software is stored in a storage medium such as a hard disk fixedly installed in the computer or a storage medium detachably set to the computer such as, for example, a CD ROM, a DVD, and a flash memory. Such a storage medium is denoted by a reference symbol 101. A processor 102 calls out a predetermined processing recipe from the storage medium 101 and executes it based on a command from a user interface (not illustrated) as needed. Accordingly, each functional component of the substrate processing apparatus is operated under the control of the controller 100 and a predetermined processing is performed. The controller 100 is either a system controller configured to control the entire operation of substrate processing system in which the substrate processing apparatus is incorporated or a controller which is operated by being linked with such a system controller.

Next, the operation of the substrate processing apparatus will be described. The operation described below is performed under the control of the controller 100.

First, the lift pin plate 20 and the processing fluid supply tube 40 are placed at the raised positions illustrated in FIG. 2. Then, the shutter 13 is opened, the conveyance arm 90, which holds a wafer W such that the surface to be processed faces downward, is introduced into the inside of the case 10 from the outside of the substrate processing apparatus, and the wafer W (illustrated with a two-dot chain line in FIG. 2) is positioned directly above the lift pin plate 20. Subsequently, the conveyance arm 90 descends and the wafer W (illustrated with a solid line in FIG. 2) is disposed on the lift pins 22 of the lift pin plate 20.

Next, the lift pin plate 20 and the processing fluid supply tube 40 are moved to the lowered position illustrated in FIG. 1. Thus, as described above, the substrate holding members 34 fluctuate and the wafer W is held by the substrate holding member 34. Also, the wafer W is apart from the lift pins 22 to be positioned slightly above of the lift pins 22. As a result, the carry-in of the wafer W is ended.

When the carry-in of the wafer W is ended, the first holding state determination device 60 and the second holding state determination device 70 are operated and the holding state of the wafer W is determined.

The first holding state determination device 60 determines the presence/absence of the wafer W as described above. A situation in which the wafer W does not exist, it is believed results from that, for example, the conveyance arm 90, which should be introduced into the inside of the case 10 in the state in which it holds the wafer W, does not hold the wafer W due to a certain problem which has occurred in the outside of the substrate processing apparatus.

The second holding state determination device 70 determines whether or not the wafer W is laid on the substrate holding members 34. Also, the wafer may be laid on the substrate holding members 34 as illustrated in FIG. 3B when, for example, the conveyance arm 90 is disposed at an improper position above the lift pin plate 20. When the carry-in/carry-out of the wafer W is performed, the rotation driving unit 36 having a rotational angle control function stops the lift pin plate 20 and the holding plate 30 at the angular position where the connecting member 24 and the push rod 54 are aligned with each other in the vertical direction. Also, a rotational angle sensor (not illustrated) configured to detect a rotational angular position of the rotation driving unit 36 or the rotating shaft 35 is provided to implement the rotational angle control function of the rotation driving unit 36. Further, when the holding plate 30 is at such an angular position, the light projector 71 and the light receiver 72 are provided such that the light path 74 of the second holding state determination device 70 crosses the substrate holding members 34.

By rotating the holding plate 30 which holds the wafer W such that the three substrate holding members 34 are sequentially positioned at a position where the holding members 34 intersect the light path 74, it may be determined whether or not the wafer W is laid on each of the substrate holding members 34 by the second holding state determination device 70 alone. Alternatively, three second holding state judging devices 70 may be provided. In this case, when the holding plate 30 is at the above-described angular position, the light path 74 is caused to cross one of the three second holding state determination devices 70. Then, determination as to whether or not the wafer W is laid on the three substrate holding members 34 may be performed at once.

When it is determined that the holding state of the wafer W is proper by the first holding state determination device 60 and the second holding state determination device 70, the wafer W is rotated by the rotation driving unit 36, a needed processing liquid is supplied to the rear surface of the wafer W from the opening 42 at the top end of the processing fluid supply tube 40, and a predetermined processing (for example, a chemical liquid cleaning processing, a rinsing processing, or a drying processing) is performed on the wafer W.

When it is determined that the wafer W does not exist by the determination unit 63 of the first holding state determination device 60, the determination unit 63 sends a signal notifying to that effect to the controller 100. The controller 100 causes the substrate processing apparatus to be in a stand-by state until a separate wafer W is loaded without performing a subsequent processing. According to this, unnecessary consumption of processing liquids may be suppressed. Also, in the case of the illustrated exemplary embodiment, when the processing liquid is ejected from the processing fluid supply tube 40 in a state in which no wafer W exists, the processing liquid is scattered into the case 10 and contaminates the inside of the case 10. However, such a situation may be suppressed in advance by determining the presence/absence of a wafer.

When it is determined that the wafer W is laid on by the determination unit 73 of the second holding state determination device 70, the determination unit 73 sends a signal notifying to that effect to the controller 100. The controller 100 operates the elevation driving unit 50 and sends a command to the controller of the conveyance arm 90 to perform again the holding operation of the wafer W (that is, returning the wafer W to the conveyance arm 90 first and then holding the wafer W again by the substrate holding members 34). After the holding operation is performed again, determination is performed again by the determination unit 73 and a predetermined processing is performed on the wafer W when it is confirmed that the wafer W is properly held. When it is determined that the wafer W is not properly held even after the holding operation has been performed again, the controller 100 notifies an operator of the abnormality using an alarm means (not illustrated) such as a display or an alarm sound generating device. The operator receives the alarm and performs a maintenance work.

When the predetermined processing is ended, the lift pin plate 20 and the processing fluid supply tube 40 are moved from the lowered position to the raised position by the elevation driving unit 50. In this process, the wafer W is released from the substrate holding member 34 and disposed on the lift pins 22 of the lift pin plate 20. Then, the wafer W is received by the conveyance arm 90 introduced into the case 10 through the carry-in/carry-out opening 12 (unload of the wafer W) and carried out to the outside of the substrate processing apparatus.

According to the above-described exemplary embodiment, the wavelength of the detection light is set to a wavelength which does not penetrate the wafer W. In addition, the substrate surrounding members (the configurational members of the substrate processing apparatus which should be disposed around the wafer W hold by the substrate holding member 34 such as, for example, the rotating cup 31, the outer cup 38, and the substrate holding member 34) which the light paths 64, 74 of the detection light from the light projectors 61, 71 to the light receivers 62, 72 pass are formed of a material which may transmit the detection light. Therefore, the detection of the holding state of the wafer W may be performed without getting affected by the substrate surrounding members. Thus, the flexibility of disposing the holding state determination device (the light projector and the light receiver) is significantly enhanced. Also, since the limitation that the holding state may not be determined when the wafer W is surrounded by the substrate surrounding members is removed, the flexibility of timing of executing the holding state determination is significantly enhanced.

Further, the determination of the holding state by the second holding state determination device 70 may be continuously executed while the wafer W is rotating. In this case, based on a detection value of the rotational angle sensor (described above but not illustrated), the detection of the holding state of the wafer W may be performed by the second holding state determination device 70 at the timing when the substrate holding members 34 pass the light path 74. Accordingly, even when the holding state of the wafer W changes due to, for example, a vibration occurring during the rotation, the rotation may be emergently stopped and the damage of the wafer W and the substrate processing apparatus may be suppressed.

In the above descriptions, the description, "the detection light penetrates," does not define that the transmissivity is substantially 100% and the description, "the detection light does not penetrate" does not define that the transmissivity is substantially 0%. It is may be sufficient if "transmitting detection light penetrates" ("non-transmitting detection light") is to the extent of causing a meaningful difference which may serve as a basis of determining an output signal of the light receivers 62, 72.

The structure of the substrate processing apparatus is not limited to the illustrated one. For example, the substrate processing apparatus may be configured to supply a processing liquid to the top surface of a substrate. Also, for example, the substrate processing apparatus may include a substrate holding mechanism in a form in which a substrate is held on the underside of a rotary top plate by movable substrate holding members provided on the rotary top plate. Further, the substrate processing apparatus may include a vacuum chuck configured to vacuum-adsorb the central part of the bottom surface of a substrate. The processing fluids supplied to the substrate are not limited to a liquid and may be a gas. The substrate may not be rotated.

Figures 4A, 4B:
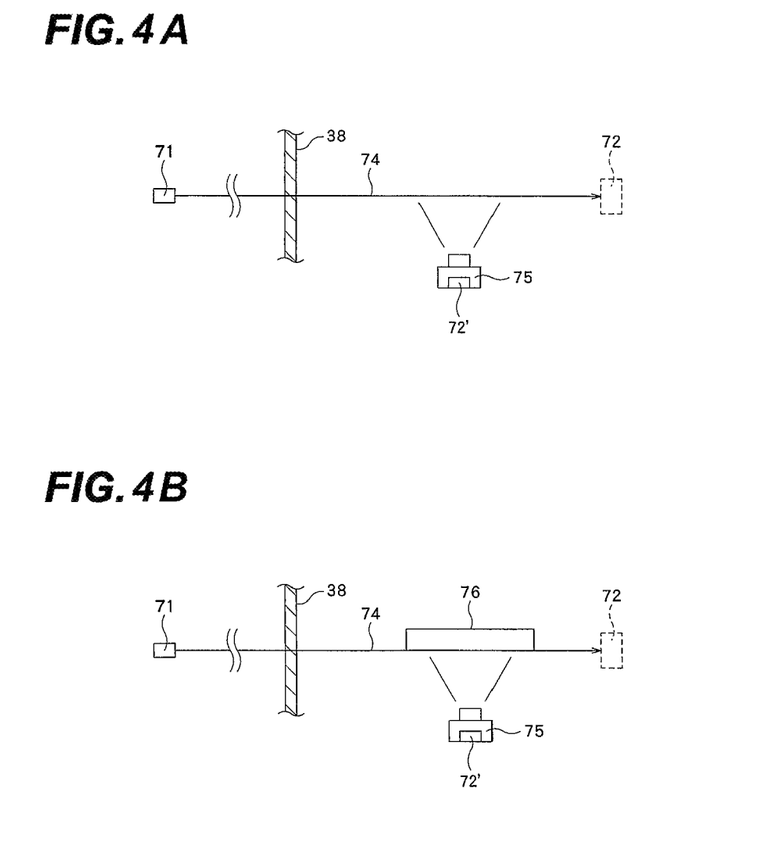
FIGS. 4A and 4B are schematic views illustrating different arrangements of a light receiver in the substrate processing apparatus.

Also, as illustrated in FIGS. 4A and 4B, reception of the detection light may be performed using a separate configuration. In the modified exemplary embodiment illustrated in FIG. 4A, instead of disposing the light receiver 72 (illustrated with a broken line) on the light path 74, an image capturing device 75 including a light receiver 72' (for example, a CCD array) is disposed at a side of the light path 74 in a region downstream of a substrate surrounding member (here, the outer cup 38) in the proceeding direction of the detection light. Since the detection light is scattered in the air, a linear image of the detection light (of the scattered light of the detection light) may be obtained by performing an image capturing from a side of the light path 74 when the detection light exists on the light path 74. Based on this image, the degree of shielding of light by the wafer W (not illustrated) at the upstream side of the substrate surrounding member in relation to the proceeding direction of the detection light may be measured. Also, in the modified exemplary embodiment of FIG. 4B, a projection wall (screen) 76 is disposed along the light path 74 in a region downstream of a substrate surrounding member (here, the outer cup 38) in the proceeding direction of the detection light. When the projection wall 76 is installed such that a surface of the projection wall 76 forms a slight angle with the light path 74, the detection light is linearly projected on the surface of the projection wall 76. When the projection wall 76 is photographed by the image capturing device 75 including the light receiver 72', an image of reflected light of the detection light may be obtained. Based on the image obtained in this manner, the degree of shielding of the detection light by the wafer W (not illustrated) at the upstream side of the substrate surrounding member in relation to the proceeding direction of the detection light may be measured. When light in an infrared region (for example, LED light with wavelength 880 nm), which is absorbed to Si, is used as the detection light, the detection light also heats a semiconductor device as a light receiving element which is used in the light receiving unit. Therefore, when the holding state determination is continuously performed, the thermal burden of the light receiving unit may increase. Thus, cooling should be considered sometimes. However, according to the exemplary embodiments of FIGS. 4A and 4B, it is needless to consider cooling of the light receiver 72' since the detection light incident on the light receiver 76' is weak enough. Also, in the exemplary embodiments in FIGS. 4A and 4B, when cooling is needed at the detection light entering portion (the portion denoted by symbol 72 and illustrated with a broken line) a cooling means (such as e.g., an air-cooling fan, a water jacket) may be provided at the portion.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
holding a substrate by a substrate holding member;
determining a holding state of the substrate held by the substrate holding member in which detection light is radiated from a light projector and received by a light receiver, and the holding state of the substrate is determined based on whether or not the detection light is received by the light receiver or on the light receiving by the light receiver; and
performing a processing on the substrate by supplying a processing fluid to the substrate held by the substrate holding member after it is determined that the substrate is properly held by the substrate holding member,
wherein the light projector and the light receiver are positioned such that a light path of the detection light from the projector toward the light receiver passes a region where the substrate exists when the substrate is held by the substrate holding member and passes the substrate surrounding member, and
the detection light radiated from the light projector has a wavelength which penetrates the substrate surrounding member but does not penetrate the substrate.

2. The substrate processing method of claim 1, wherein the processing of the substrate is not performed and a determination result is notified when it is determined that the substrate is not held or improperly held by the substrate holding member.

3. The substrate processing method of claim 1, wherein, the holding state of the substrate is continuously determined even after the processing is started and when it is determined that abnormality occurs in the holding state, the processing of the substrate is ended and a judgment result is notified.

4. A substrate processing apparatus comprising:
a substrate holding member configured to hold a substrate;
a substrate surrounding member provided to be disposed around the substrate held by the substrate holding member;
a light projector configured to radiate detection light; and
a light receiver configured to receive the detection light radiated from the projector,
wherein the light projector and the light receiver are positioned such that a light path of the detection light from the projector toward the light receiver passes a region where the substrate may exist when the substrate is held by the substrate holding member and passes the substrate surrounding member, and
the detection light radiated from the light projector has a wavelength which penetrates the substrate surrounding member but does not penetrate the substrate.

5. The substrate processing apparatus of claim 4, wherein the light projector and the light receiver are positioned such that the light path is blocked by the substrate when the substrate is held by the substrate holding member in an abnormal state and the light path is not blocked by the substrate when the substrate is held by the substrate holding member in a normal state.

6. The substrate processing apparatus of claim 5, wherein the substrate surrounding member includes the substrate holding member, and
the light path of the detection light is set to pass a front end of the substrate holding member which is holding the substrate in the normal state.

7. The substrate processing apparatus of claim 4, wherein the light projector and the light receiver are positioned such that the light path is blocked by the substrate held by the substrate holding member when the substrate is normally held by the substrate holding member.

8. The substrate processing apparatus of claim 7, further comprising:
a plate which supports the substrate holding member and approaches the substrate from the lower side of the substrate retained by the substrate holding member,
wherein the substrate surrounding member includes the plate, and
the light path of the detection light is set at a location where it passes the plate vertically.

9. The substrate processing apparatus of claim 4, further comprising:
a plate configured to support the substrate holding member and to approach the substrate from the underside of the substrate held by the substrate holding member,
wherein the substrate surrounding member includes the plate and the substrate holding member,
two sets of light projectors and light receivers are provided, and
in the two sets of the projectors and the light receivers, a first set of the light projector and the light receiver are positioned such that, when the substrate is normally held by the substrate holding member, the light path of the detection light from the light projector toward the light receiver in the first set does not pass the substrate and passes a front end of the substrate holding member, and when the substrate is laid on the holding member, the light path of the detection light from the light projector toward the light receiver in the first set is blocked by the substrate, and
the light projector and the light receiver of a second set are positioned such that the light path of the detection light from the projector toward the light receiver in the second set passes the plate vertically and, when the substrate is retained by the substrate holding member in the normal state, the light path of the detection light from the light projector toward the light receiver in the second set is blocked by the substrate held by the substrate holding member in the normal state.

10. The substrate processing apparatus of claim 4, wherein the substrate surrounding member includes a substrate enclosure member configured to enclose the circumference of the substrate retained by the substrate holding member, and at least one of the light projector and the light receiver is disposed in the outside of the substrate enclosure member.

11. The substrate processing apparatus of claim 10, further comprising:
a processing liquid nozzle configured to supply a processing liquid to the substrate held by the substrate holding member; and
a rotation driving unit configured to rotate the substrate holding member,
wherein the substrate enclosure member is a cup body configured to receive the processing liquid supplied from the processing liquid nozzle to the substrate and scattered to the outside of the substrate by centrifugal force and the light projector and the light receiver are disposed in the outside of the cup body.

12. The substrate processing apparatus of claim 4, further comprising:
a case configured to accommodate the substrate holding member and the substrate surrounding member,
wherein the light projector is installed in the outside of the case.

13. The substrate processing apparatus of claim 4, wherein the substrate is formed of silicon or silicon compound, and the substrate surrounding member formed of a resin material.

14. The substrate processing apparatus of claim 4, wherein the wavelength is 1100 nm or less.

15. The substrate processing apparatus of claim 4, wherein the projector has a light emitting diode as a light emitting device.

* * * * *